United States Patent

Fischer

[11] 4,162,507
[45] Jul. 24, 1979

[54] CONTACT STRUCTURE FOR A MULTIPLE SEMICONDUCTOR COMPONENT

[75] Inventor: Konrad Fischer, Bad Rappenau, Fed. Rep. of Germany

[73] Assignee: Licentia Patent-Verwaltungs G.m.b.H., Frankfurt, Fed. Rep. of Germany

[21] Appl. No.: 865,596

[22] Filed: Dec. 28, 1977

[30] Foreign Application Priority Data

Jan. 22, 1977 [DE] Fed. Rep. of Germany ....... 2702571

[51] Int. Cl.² .................... H01L 23/48; H01L 29/44; H01L 29/52
[52] U.S. Cl. ....................... 357/68; 357/30; 357/65; 357/59
[58] Field of Search ............... 357/65, 68, 59, 30

[56] References Cited

U.S. PATENT DOCUMENTS

| | | | |
|---|---|---|---|
| 3,430,115 | 2/1969 | Webb | 357/68 |
| 3,457,631 | 7/1969 | Hall et al. | 357/68 |
| 3,652,907 | 3/1972 | Page et al. | 357/68 |
| 3,756,924 | 9/1973 | Collins et al. | 357/68 |
| 3,896,486 | 7/1975 | Wright | 357/68 |
| 4,000,508 | 12/1976 | Hager et al. | 357/71 |
| 4,079,507 | 3/1978 | King | 357/59 |
| 4,091,409 | 5/1978 | Wheatley | 357/68 |

*Primary Examiner*—Andrew J. James
*Attorney, Agent, or Firm*—Spencer & Kaye

[57] ABSTRACT

A contact structure for a multiple semiconductor component comprises at least two adjacent hand shaped connecting contact arrangements with the fingers parting in opposite directions and splayed out, each finger being interrupted by one of the individual semiconductor components.

10 Claims, 2 Drawing Figures

CONTACT STRUCTURE FOR A MULTIPLE SEMICONDUCTOR COMPONENT

BACKGROUND OF THE INVENTION

The invention relates to a contact structure for a multiple semiconductor component made from a number of two-terminal individual elements having individual finger-shaped extensions for one contact of each element in each case and with a large area connecting contact with which are connected the other contacts of an entire group of elements.

For example, when manufacturing infra-red detector cells it is necessary to arrange a plurality of individual cells in a row. In order to manufacture these infra-red detectors it is necessary to proceed so that a semiconductor layer sensitive to infra-red light is applied to a carrier body. This semiconductor layer is comb-shaped and comprises a wide limb from which emanate numerous finger-shaped tongues parallel to each other and in one direction. This comb-shaped semiconductor layer is covered by a contact metal over its entire surface, the said contact metal only leaving a small gap in the transition region between the finger-shaped tongues and the broad limb free. This gap, only in which infra-red light can fall in the semiconductor layer, forms a detector cell in each case which is connected on the one hand to the wide limb and on the other hand to a finger-shaped tongue. A connection, namely the wide limb connecting the tongues together is thus common to all of the detector cells.

The know structure has the disadvantage that the spacing between two finger-shaped tongues at the outer edge of the structure cannot be reduced as desired since contacting wires must be applied to the ends of the tongue-shaped connectors.

SUMMARY OF THE INVENTION

It is an object of the invention to provide a contact structure which, without enlarging the overall structure, makes it possible to provide a plurality of detector cells lying on one line and closely adjacent each other with connections which are accessible from outside.

According to the invention there is provided a contact structure for a multiple component semiconductor device having a number of two terminal individual components comprises at least two hand shaped connecting contact arrangements having a plurality of splayed apart fingers with each said finger interrupted by a two terminal individual component and with said two hand-shaped connecting contact arrangements being rotated by 180° relative to each other to form a substantially rectangular overall structure.

Further according to the invention, there is provided a contact structure for a component multiple semiconductor device made up of a number of two terminal individual components having individual finger-shaped connections for one contact of each component respectively and a large area connecting contact to which are connected to other contacts of a whole group of components, characterised in that a group of connecting fingers arranged in comb shape and fanned out extend from one outer edge of the contact structure to the centre of the structure so that the spacing between two adjacent contact fingers decreases inwardly; that these connecting fingers—interrupted by one component in each case—merge into the large area connecting contact extending up to the other edge of the structure; and that two individual structures of this type rotated by 180° with respect to each other are joined together to form an overall structure approximately forming a rectangle.

BRIEF DESCRIPTION OF THE DRAWINGS

The invention and its further advantageous refinement will now be described in greater detail by way of example with reference to the drawings, in which.

DESCRIPTION OF THE PREFERRED EMBODIMENTS

In a preferred embodiment of the invention, in a contact structure of the type described at the outset, a group of connection fingers arranged in the shape of a comb and fanned out extend from one outer edge of the contact structure to the centre of the structure so that the spacing at two adjacent contact fingers decreases inwardly so that these connection fingers—interrupted in each case by a component—merge into the large area connecting contact extending to the other edge of the structure, and two individual structures of this type which have been rotated by 180° with respect to each other are joined together to form an overall structure approximately forming a rectangle.

The contact structure in accordance with the invention has the advantage that detectors can be arranged very closey adjacent each other, and despite this, the finger shaped connections at the outer edge of the overall structure have a sufficiently large spacing from each other to ensure safe contacting of these connections. Since two individual structures respectively rotated by 180° with respect to each other form an approximately rectangular overall structure there are no difficulties in incorporating very long detector lines into a casing since there are equal numbers of connections starting from the entire contact strip and perpendicular to the direction of expansion of the structures on each side.

In this arrangement, therefore, several overall structures are preferably placed in a row so that the individual components of all structures form a straight line. The contact structure is—as already shown—particularly suited to contacting infra-red detectors arranged in a row. With the contact structure, the largest part of the structured edge at the outer edge of the overall structure is taken up by the ends of the finger-shaped connections, while only the fairly small residue belongs to the large area connecting contact of the bordering individual structure. The structured edge on the outer edge of an overall structure is preferably divided up approximately in the ratio of 7 to 3 between the finger-shaped connections and the large area connection contact. This embodiment of the structure makes it possible to enlarge the spacing between two adjacent connecting fingers at the outer edge of the overall structure by approximately 30% with respect to the spacing in the centre of the structure.

Figure 1:
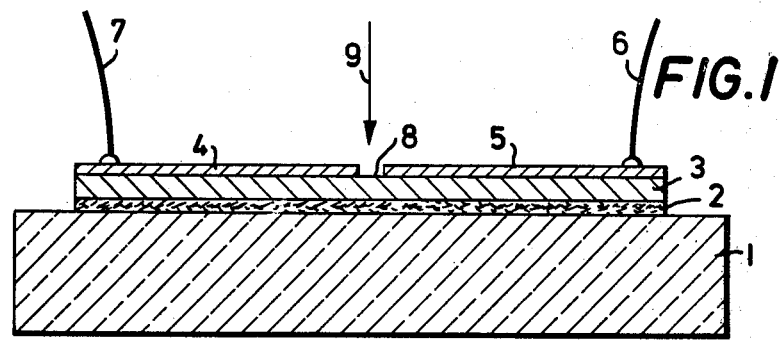
FIG. 1 shows a transverse section (along a line AA of FIG. 2) through a detector element and the connection conductor tracks starting therefrom.

Referring now to the drawings, in order to manufacture a multiple infra-red detector a semiconductor layer 3 sensitive with respect to infra-red light is applied in accordance with FIG. 1 to a carrier body 1. The carrier body 1 may comprise a sapphire for example to which is attached a cadmium-mercury-telluride disc with the aid of an adhesive 2. This semiconductor disc is then reduced to a remaining thickness of approximately 15 to 20 μm. The remaining thin cadmium-mercury-telluride layer 3 which is sensitive to infra-red light is provided with a structure 14 as shown in the lower part of FIG. 2. The dotted regions show the remaining semiconductor layer while in the shaded regions the carrier body rises to the surface. An individual structure has 5 finger-shaped tongues 13a or 13b respectively for example which merge into a limb 12a or 12b common to all fingers. The tongues 13 are fanned out so that at the outer edge of the structure between two adjacent connecting fingers a spacing b of 130 to 140 μm for example remains. This spacing is reduced towards the centre of the structure and amounts to a = 100 μm for example. Two of these individual structures are rotated by 180° with respect to each other and then again form an approximately rectangular overall structure 14 whereby the edge length at the structured outer edge is 1 mm for example. Approximately 700 μm of this length is then taken up by the finger-shaped tongues 13, while the remaining 300 μm falls to the large area limb 12 of the adjacent individual structure. An overall structure 15 joined together from two individual structures 10 and 11 is thus symmetrical about its centre point and has angled tongues such that the described fanning out is achieved.

Figure 2:
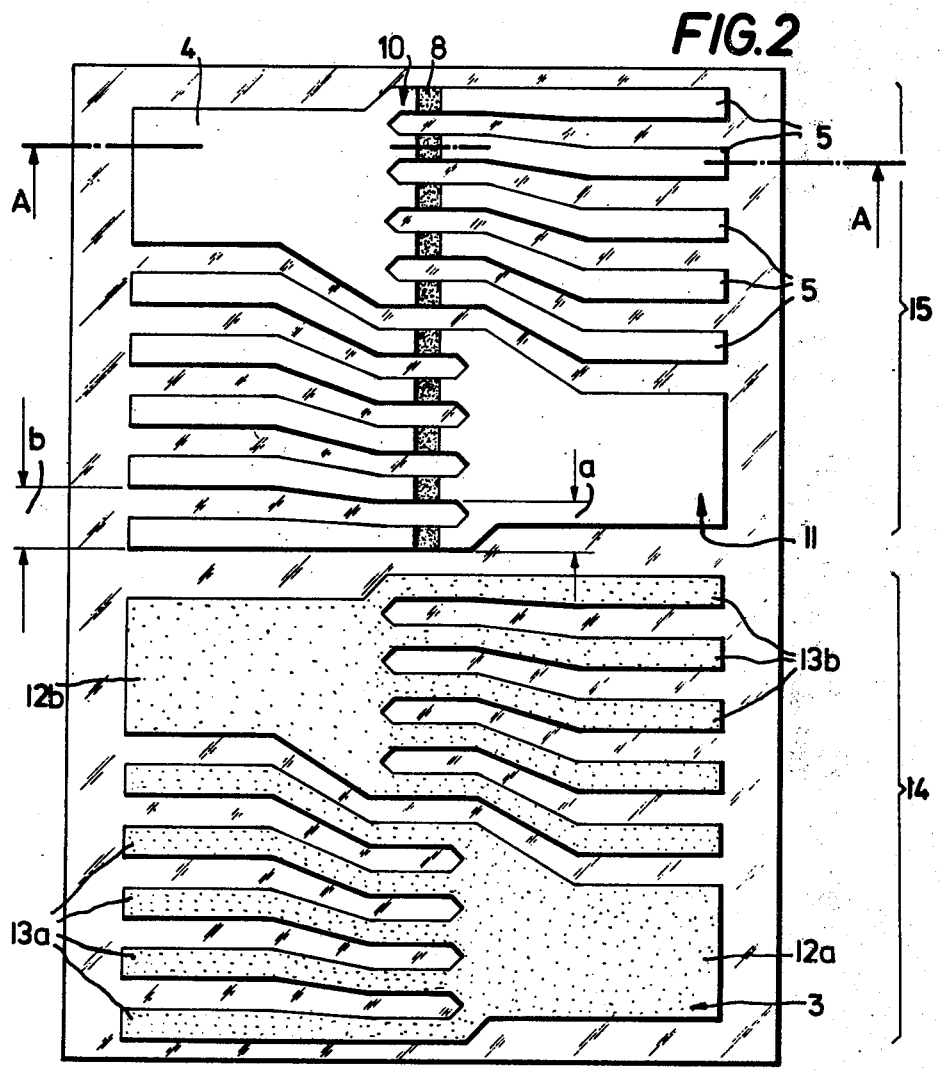
FIG. 2 shows two adjacent overall structures in plan view whereby the lower structure only shows the semiconductor layer while the upper structure shows the end structure already provided with the contact conductor tracks.

The semiconductor layer 3 is further coated with metal as the structure 15, which has been further worked, shows in FIG. 2 so that only a small gap 8 remains free approximately at the centre of the structure. This gap forms the infra-red detector since only there can infra-red light 9 (FIG. 1) fall on the semiconductor layer. From FIG. 2 it is apparent that the gaps 8 forming the infra-red detectors are arranged in a straight line. As may be seen from FIG. 1, two metal contacts 4 and 5 lead to this infra-red detector 8, these comprising indium, for example. These contacts 5 and 4 cover the finger-shaped semiconductor tongues 13a or 13b and the large area semiconductor limbs 12a or 12b in accordance with FIG. 2 almost completely. In accordance with FIG. 1, leads 6 and 7 must be arranged from the outside on these contacts 5 and 4. The leads 6 and 7 comprise gold wires, for example, which are connected to the indium contact layer 4 and 5 by means of thermocompression. It is of advantage to apply two leads or connections to the large area connecting contacts 4 on the semiconductor regions 12a and 12b in order to increase the certainty of contact. On the other hand one connecting contact respectively is applied to the free ends of the connecting fingers 5 on the semiconductor tongues 13a and 13b whereby the relatively large spacing between two adjacent connecting fingers facilitates safe contacting of the connecting conductive tracks.

Overall structures of the type shown can be placed in a row in any desired number so that numerous infra-red detectors lie in a straight line these detecting the infra-red light which is incident on this line in each case. Since in equally large number of connecting fingers lead away to each side because of the connecting structure selected, incorporation of the entire arrangement into a casing is easily possible since the connection as a whole can be divided up symmetrically. This has the advantage too that the number of adjacent overall structures is variable.

What is claimed is:

1. A contact structure for a multiple component semiconductor device made up of a number of two terminal individual components having individual finger-shaped connections for one contact of each component respectively and a large area connecting contact to which are connected the other contacts of a whole group of components, characterised in that a group of connecting fingers arranged in comb shape and fanned out extend from one outer edge of the contact structure to the centre of the structure so that the spacing between two adjacent contact fingers decreases inwardly; that these connecting fingers—interrupted by one component in each case—merge into a large area connecting contact extending up to the other edge of the structure; and that two individual structures of this type rotated by 180° with respect to each other are joined together to form an overall structure approximately forming a rectangle.

2. A contact structure as defined in claim 1, and comprising several overall structures arranged in a row with the individual components of all said overall structures forming a straight line.

3. A contact structure as defined in claim 1 and comprising a number of infra-red detectors arranged in a row.

4. A contact structure as defined in claim 1, wherein the ends of said finger-shaped connections take up the largest part of the structured edge at the outer edge of said overall structure and said large area connecting contact of the bordering individual structure takes up only a relatively small part of said structured edge.

5. A contact structure as defined in claim 4, wherein the ratio of the part of said edge taken up by said finger-shaped connections to the part of said edge taken up by a large area connecting contact is 7:3.

6. A contact structure as defined in claim 1, wherein the spacing of two adjacent connecting fingers at the outer edge of said overall structure is greater than at the centre of said structure by approximately 30%.

7. A contact structure as defined in claim 1, wherein said structured edge of the outer edge of said overall structure is approximately 1 mm long.

8. A contact structure as defined in claim 1 wherein said two individual structures rotated by 180° with respect to one another are juxtaposed such that the large area connecting contact of each of said individual structures is adjacent and extends to the same said outer edge of said contact structure as the group of connecting contacts of the adjacent said individual structure.

9. In a multiple element semiconductor component including a plurality of individual two terminal elements and a contact structure for said elements including an individual finger shaped contact for one terminal of each of said elements and a large area common connecting contact for the other terminal of at least a group of said plurality of elements; the improvement wherein said contact structure includes: at least two comb-shaped connecting contact arrangements each having a large area connecting contact which extends from one edge of said contact structure toward the center of same, and a number of fanned out connecting fingers, each having a gap between which a respective one of said elements is connected, which extend from said large area connecting contact to the opposite edge of said contact structure with the spacing between each pair of adjacent connecting fingers decreasing from said opposite outer edge toward said large area connecting contact; and adjacent ones of said comb-shaped connecting contact arrangements are rotated by 180° with respect to one another with the large area connecting contact of one of said comb-shaped connecting contacts being adjacent and extending to the same edge of said contact structure as said number of connecting fingers of the adjacent ones of said comb-shaped connecting contact arrangements so that each pair of said comb-shaped connecting contact arrangements forms an approximately rectangular shaped contact structure.

10. A component as defined in claim 9 wherein said semiconductor component further includes a carrier body, and at least first and second symmetrical infrared sensitive semiconductor bodies positioned adjacent one another on the surface of said carrier, each of said semiconductor bodies having a comb shape corresponding to that of one of said connecting contact arrangements, and underlying and being contacted by a respective one of said comb-shaped connecting contact arrangements over its entire surface except for said gap.

* * * * *